United States Patent
Britton et al.

(10) Patent No.: US 9,320,145 B2
(45) Date of Patent: Apr. 19, 2016

(54) ASSEMBLING AND PACKAGING A DISCRETE ELECTRONIC COMPONENT

(75) Inventors: David Thomas Britton, Cape Town (ZA); Margit Harting, Cape Town (ZA)

(73) Assignee: PST Sensors (Proprietary) Limited, Cape Town (SA)

( * ) Notice: Subject to any disclaimer, the term of this patent is extended or adjusted under 35 U.S.C. 154(b) by 204 days.

(21) Appl. No.: 13/822,754

(22) PCT Filed: Sep. 13, 2011

(86) PCT No.: PCT/IB2011/053999
§ 371 (c)(1),
(2), (4) Date: Apr. 22, 2013

(87) PCT Pub. No.: WO2012/035493
PCT Pub. Date: Mar. 22, 2012

(65) Prior Publication Data
US 2013/0199826 A1 Aug. 8, 2013

(30) Foreign Application Priority Data
Sep. 13, 2010 (ZA) ................................ 2010/06533

(51) Int. Cl.
*H05K 7/00* (2006.01)
*H05K 1/16* (2006.01)
(Continued)

(52) U.S. Cl.
CPC ................ *H05K 1/16* (2013.01); *H01G 11/48* (2013.01); *H05K 1/167* (2013.01); *H01G 11/28* (2013.01); *Y02E 60/13* (2013.01)

(58) Field of Classification Search
CPC ......... H05K 1/16; H05K 1/167; H01G 11/48; H01G 11/28; Y02E 60/13
USPC ................... 174/251, 255–258; 361/760, 765
See application file for complete search history.

(56) References Cited

U.S. PATENT DOCUMENTS

| 4,200,970 A | | 5/1980 | Schonberger |
| 4,332,081 A | * | 6/1982 | Francis ................. G01K 7/223 29/612 |

(Continued)

FOREIGN PATENT DOCUMENTS

| AT | 369186 | 12/1982 |
| BE | 865.852 | 7/1978 |

(Continued)

OTHER PUBLICATIONS

Office action issued by Japanese Patent Office for corresponding application JP 2013-527730 dated Dec. 16, 2014 with English translation.

*Primary Examiner* — Hoa C Nguyen
(74) *Attorney, Agent, or Firm* — Frommer Lawrence & Haug LLP

(57) ABSTRACT

An electronic component assembly comprises a printed component structure comprising at least one of a semiconducting ink, an insulating ink and a conducting ink deposited onto a substrate. The component structure defining at least one contact area, with a connecting lead disposed against or adjacent to the contact area. At least one layer of electrically insulating material encloses the component structure. At least one of the substrate and the layer of electrically insulating material comprises packaging material. The component structure can be printed on a substrate such as paper or another soft material, which is secured to a layer of insulating packaging material such as polyethylene. Instead, the substrate can be the insulating packaging material itself. Variations using hard and soft substrates are possible, and various examples of electronic component assembly are disclosed.

27 Claims, 4 Drawing Sheets

(51) Int. Cl.
*H01G 11/48* (2013.01)
*H01G 11/28* (2013.01)

(56) References Cited

U.S. PATENT DOCUMENTS

| | | | |
|---|---|---|---|
| 4,415,607 A | 11/1983 | Denes et al. | |
| 4,874,924 A | 10/1989 | Yamamoto et al. | |
| 5,074,944 A * | 12/1991 | Trenka | B30B 1/00 100/237 |
| 5,363,084 A | 11/1994 | Swinehart | |
| 5,622,652 A | 4/1997 | Kucherovsky et al. | |
| 5,758,575 A | 6/1998 | Isen et al. | |
| 5,763,058 A | 6/1998 | Isen et al. | |
| 6,010,771 A | 1/2000 | Isen et al. | |
| 6,049,094 A * | 4/2000 | Penry | G02F 1/0305 257/100 |
| 6,152,597 A * | 11/2000 | Potega | G01K 1/02 324/104 |
| 2001/0055231 A1 | 12/2001 | Tsuruta | |
| 2004/0098216 A1 | 5/2004 | Ye et al. | |
| 2004/0148120 A1 | 7/2004 | Ye et al. | |
| 2004/0153279 A1 | 8/2004 | Ye et al. | |
| 2004/0162692 A1 | 8/2004 | Ye et al. | |
| 2004/0230396 A1 | 11/2004 | Ye et al. | |
| 2005/0125184 A1 | 6/2005 | Ye et al. | |
| 2006/0199313 A1 | 9/2006 | Harting et al. | |
| 2007/0148416 A1* | 6/2007 | Wolkin et al. | 428/195.1 |
| 2007/0234918 A1 | 10/2007 | Hirahara et al. | |
| 2011/0045601 A1* | 2/2011 | Gryska et al. | 436/149 |
| 2011/0318905 A1 | 12/2011 | Chiruvolu et al. | |
| 2013/0016756 A1 | 1/2013 | Wolkin et al. | |

FOREIGN PATENT DOCUMENTS

| | | |
|---|---|---|
| BR | 8801903 A | 4/1988 |
| CA | 1 101 128 A | 5/1981 |
| CA | 2 224 147 A | 12/1996 |
| CA | 2 224 236 A | 4/1997 |
| CH | 631 569 A | 8/1982 |
| CN | 1030508 A | 1/1989 |
| DE | 28 15 003 A | 10/1978 |
| EP | 0 290 159 A | 11/1988 |
| EP | 1 841 301 A | 10/2007 |
| ES | 468.765 A | 4/1978 |
| FR | 2 423 848 A | 11/1979 |
| GB | 1 601 853 | 11/1981 |
| GR | 780164137 B | 8/1980 |
| IL | 54413 A | 12/1979 |
| JP | 53-128753 | 11/1978 |
| JP | 63-167696 U | 11/1988 |
| JP | 1-79292 U | 5/1989 |
| JP | 2006-505940 A | 2/2006 |
| JP | 2006-516819 A | 7/2006 |
| JP | 2007-180523 | 7/2007 |
| JP | 2007-180523 A | 7/2007 |
| JP | 2007-300077 A | 11/2007 |
| JP | 2008-130639 A | 6/2008 |
| KR | 10-2007-0098648 | 10/2007 |
| KR | 10-2009-0024771 | 3/2009 |
| LU | 79425 | 7/1979 |
| NL | 7804020 | 10/1978 |
| SE | 78041993 | 4/1978 |
| WO | WO 96/40522 A | 12/1996 |
| WO | WO 97/14157 A | 4/1997 |
| WO | WO 2004/042791 A | 5/2004 |
| WO | WO 2004/068536 A | 8/2004 |
| WO | WO 2007/004014 A | 1/2007 |
| WO | WO 2007/023362 A | 3/2007 |
| WO | WO 2007/072162 A | 6/2007 |
| WO | WO 2009/125370 A | 10/2009 |

* cited by examiner

ASSEMBLING AND PACKAGING A DISCRETE ELECTRONIC COMPONENT

This application is a 371 of PCT/IB2011/053999 filed on Sep. 13, 2011, published on Mar. 22, 2012 under publication number WO 2012/035493 A and claims priority benefits of South African Patent Application Number 2010/06533 filed Sep. 13, 2010, the disclosure of which is incorporated herein by reference.

BACKGROUND OF THE INVENTION

This invention relates to a method of fabricating an electronic component, particularly a discrete component, and to a component fabricated by the method.

Printing of functional inks has a long tradition in the electronics field. For example, pigment based inks are used to screen print interconnections and resistors on printed circuit boards. In these applications, the thick film inks used consist of a vehicle and pigments of silver and carbon, respectively, where the pigments can have a dimension in the nanometer range.

Traditionally most functional materials have been printed by conventional printing techniques, such as screen printing. More recent developments aim at printing not only the passive components of a circuit, but also active components. One example is the printing of nanoparticulate silicon, as disclosed in International patent application WO 2004/068536, providing semiconducting layers in devices like solar cells and transistors.

In known applications of printed electronics, the aim is to integrate the individual components, either in a complete circuit or as an array of individual components to form a larger device, such as an array of transistors used to drive a display or an array of photovoltaic cells forming a complete module. In these applications, the benefits afforded by the use of printing, and related techniques, towards simplicity of processing, large scale production, and manufacturing cost reduction are common knowledge.

It is an object of the invention is to extend these benefits to the fabrication of discrete electronic components.

SUMMARY OF THE INVENTION

According to the invention there is provided a method of fabricating an electronic component, the method comprising:
  printing a component structure comprising at least one of a semiconducting ink, an insulating ink and a conducting ink onto a substrate, the component structure defining at least one contact area;
  disposing a connecting lead against or adjacent to said at least one contact area; and
  applying at least one layer of electrically insulating material to enclose the component structure,
wherein at least one of the substrate and the layer of electrically insulating material comprises packaging material.

Further according to the invention there is provided an electronic component assembly comprising:
  a. a printed component structure comprising at least one of a semiconducting ink, an insulating ink and a conducting ink deposited onto a substrate, the component structure defining at least one contact area;
  b. a connecting lead disposed against or adjacent to said at least one contact area; and
  c. at least one layer of electrically insulating material enclosing the component structure, wherein at least one of the substrate and the layer of electrically insulating material comprises packaging material.

The packaging material preferably includes but is not restricted to polymer films such as polyester or polyethylene.

The packaging material may form an enclosure or may be a covering applied to the substrate.

The electronic component may be a thick or thin film device, and may be, for example, a thick or thin film transistor, photodiode, photovoltaic cell or module, resistor, thermistor, diode, or capacitor, or another discrete component.

In a preferred example embodiment, the electronic component may be a thermistor, such as a negative temperature coefficient (NTC) thermistor generally as described in South African provisional patent application 2010/06532 of the present applicant entitled Printed Temperature Sensor, filed on 13 Sep. 2010.

Preferably, the substrate and the layer of insulating material are planar, as in the case of sheet or film materials.

At least one of the substrate and the layer of insulating material may be a soft material as defined herein.

Soft substrate materials, which can deform plastically or elastically under a relatively small compressive force, are preferred. For elastic materials, a material can be defined as soft if its hardness is less than 100 on the Shore A scale. For plastic materials, a soft material would have a Brinell hardness of typically less than 30. Hard materials can be defined as having a hardness greater than 100 on the Shore B scale or a Brinell hardness exceeding 80. Materials with intermediate values of hardness can be regarded as relatively soft, depending on the force applied. For the purposes of this invention a soft material is defined as a material with a hardness of less than 100 on the Shore A scale.

For an electronic component produced by printing techniques at ambient temperature, the substrate material may be, for example, paper sheet, card, cardboard, metal foil, plastics sheet material, polymer film, or any other suitable material with a printable surface.

In alternative embodiments of the invention, the substrate may be a hard material as defined herein.

For example, the substrate may comprise metal sheet, sintered ceramic sheet including alumina and clay based materials, crystalline ceramic materials such as quartz and sapphire, sheet or wafer semiconductor materials such as silicon or silicon carbide, or glass sheet.

The electronic component assembly may include a layer of at least one other material between the substrate surface and the layer of insulating material, said layer of at least one other material comprising a soft material as defined herein.

In a preferred embodiment the packaging material may be a sheet or film of thermoplastic polymer material.

The electronic component assembly may be protected by a polymer sealing medium applied thereto, for example by using any commonly known technique, such as dipping or spraying.

The invention extends to packaging comprising a container or wrapping of packaging material, and an electronic component assembly as defined herein.

DESCRIPTION OF EMBODIMENTS

Thermistors which have a negative temperature coefficient of resistance are commonly known as NTC thermistors, meaning that their electrical resistance decreases approximately exponentially with increasing temperature.

Existing discrete thermistors of a generally similar type to those of the present invention are composed of pastes comprising a powder of a compound semiconductor material and a binder material, such as a glass frit. This paste is either screen printed onto a ceramic substrate or cast to form a green body, after which it is sintered at high temperature to form a massive layer or body of semiconductor material. Invariably, because of distortion during the thermal treatment, further trimming of the material to obtain the correct resistance is required before metallization, in the case of thick-film thermistors. The fabrication processes applied place limitations on the substrate and packaging materials used, precluding the use of many lightweight, flexible materials such as paper and polymer film.

The invention essentially concerns the fabrication of a discrete electronic component by printing a silicon structure onto a planar substrate, and packaging the structure with at least one connecting lead between two layers of flat packaging material, the lead or leads passing out of the device between the layers of packaging material.

The component or device to be manufactured will typically be a negative temperature coefficient (NTC) thermistor, printed using silicon inks according to one of the architectures disclosed in South African patent application 2010/06532. However, the methods of assembly and packaging disclosed herein may also be applied to any other thin-film, thick-film or printed thermistor deposited on a flat or planar substrate. By extension, the same methods disclosed may also be applied to the assembly and packaging of any other thin-film, thick-film or printed electronic component, such as a thin or thick film transistor, photodiode, photovoltaic cell or module, resistor, diode, or capacitor, by way of non-limiting example.

Figure 1:
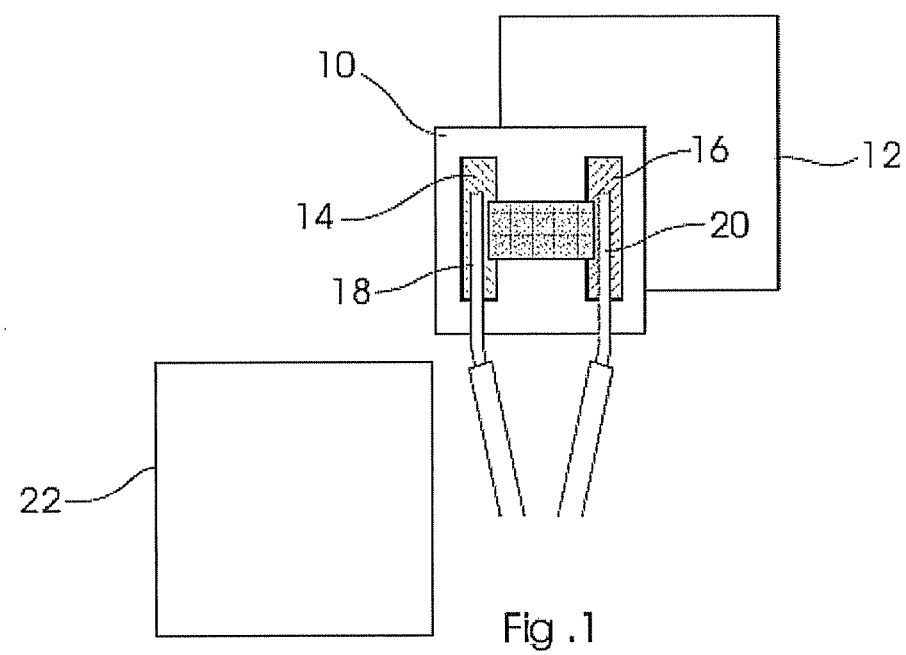
FIG. 1 is an exploded schematic representation of an electronic component according to an example of the invention.

Referring now to the drawings, FIG. 1 is a schematic representation of the assembly and packaging of an electronic component according to the method of the invention. The electronic component is deposited on a flat or planar substrate 10, by the printing method referred to above, so as to define electrically conductive contact pads 14 and 16. A pair of connecting leads or wires 18 and 20 are provided, and the bare ends of the leads are disposed against or adjacent to the contact pads as indicated in the drawing. A layer 22 of insulating material is applied to the substrate 10 to hold the different parts together.

In FIG. 1, a layer 12 of packaging material is shown to which the substrate 10 is secured by the layer 22 of insulating material. However, either the substrate 10 or the layer 22 (or both) can form part of packaging material to which the electronic component is applied, in which case the illustrated layer 12 of packaging material may be redundant.

In one embodiment, the electronic component and contact pads are deposited on the substrate 10, and the substrate 10 and the layer 22, defining the outer packaging of a container, are attached together. In this way, the contact pads 14 and 16 of the printed component are held in contact with the ends of the connecting leads 18 and 20 by the pressure exerted on them by the substrate and the outer packaging.

Further supporting or insulating materials may be included between the substrate 10 and the layer 22 of insulating material, or between the leads and the insulating material. These materials may be the same material as the substrate or the outer packaging, but be thicker to provide mechanical support. For example, such materials may be paper sheet, card or cardboard, or another soft material such as polyethylene.

Alternatively the electronic device may be printed or otherwise deposited directly onto the inner surface of the packaging material, which then forms the substrate.

Soft substrate materials, which may deform plastically or elastically under a small compressive force, are preferred. For an electronic component produced by printing techniques at ambient temperature, the substrate material may be, for example, paper sheet, card, cardboard, metal foil, plastics sheet material, polymer film, or any other suitable material, preferably having a printable surface.

Figure 2:
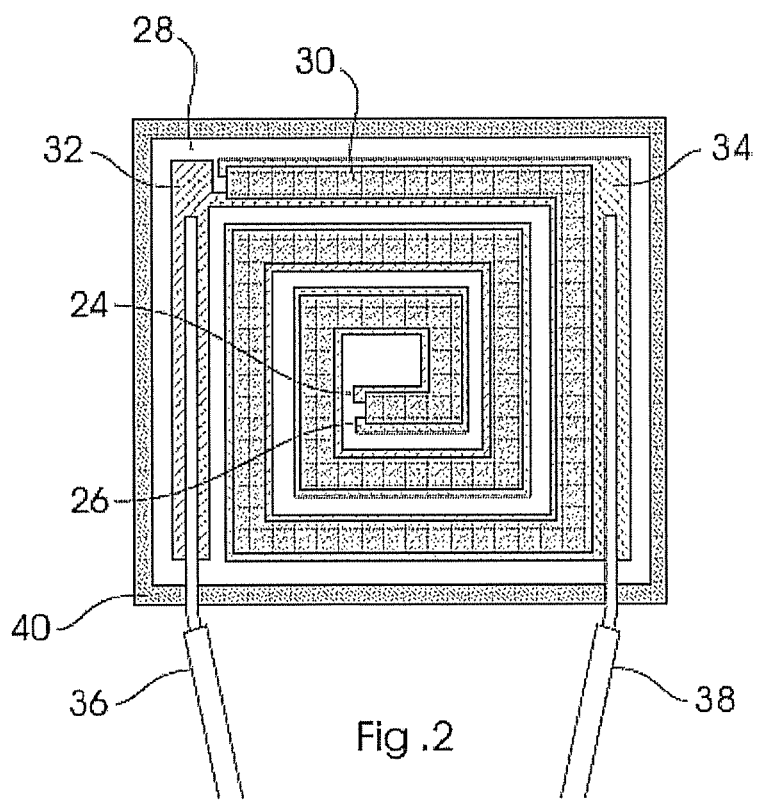
FIG. 2 is a schematic plan view of an embodiment of a printed silicon NTC thermistor fabricated according to the method of the invention.

If the substrate material is hard, or otherwise incompressible, at least one other material in contact with the substrate surface may be soft, with the physical characteristics described above. Hard or rigid materials which may be used with the fabrication processes referred to include, but are not restricted to, metal sheet, sintered ceramic sheet including alumina and clay based materials, crystalline ceramic materials such as quartz and sapphire, sheet or wafer semiconductor materials such as silicon or silicon carbide, and glass sheet.

Where the electronic component includes one or more integrated electrodes, the electrodes should preferably be deposited so that they are extended outwardly to form contact pads in an outer region of the electronic component, with at least one contact pad for each electrode. An example of such an arrangement is shown schematically in FIG. 2, which shows an embodiment of a printed NTC thermistor manufactured according to the methods disclosed. Two electrodes in the form of parallel conducting tracks 24 and 26 are deposited in a spiral pattern on a sheet of substrate material 28, and connected or bridged by a semiconductor track comprising a printed silicon layer 30. In the illustrated design the two tracks 24 and 26 are extended outwardly to form relatively wide contact pads 32 and 34 on opposite edges of the component, on which the ends of respective connecting leads 36 and 38 are placed. The complete assembly is held together between two sheets of the outer packaging material 40 (only the lowermost layer is shown in FIG. 2).

The contact pads may be deposited using any suitable known thick or thin film method and should preferably comprise the same material as that of the integrated electrode. In the preferred embodiment, a printable silver screen printing paste is used. Alternatively, inks containing graphite, fullerenes, gold, copper, aluminium or any other conducting material in the form of particles or aggregates of particles may be applied. Inks based on organic materials, such as PEDOT:PSS, are known to be used to print conducting patterns, but are not recommended for the this purpose.

Preferably, the outer surface of the packaging material is pre-printed with a logo, design, graphic or product information. Alternatively such printing may be performed after fabrication of the component and packaging.

In a preferred embodiment the outer packaging material is a thermoplastic polymer film or sheet, so that the assembled component can be sealed and rendered mechanically stable by thermal lamination.

Alternatively the outer packaging may be adhesive bonded, or in the case of a metallic material, soldered or welded.

If the outer packaging is rigid or semi-rigid, it may be closed by the use of screws, staples, bolts, rivets or any similar mechanical fastening.

In a preferred embodiment the contact leads are single strand metal wires. Alternatively, multi-strand twisted or braided wire, or flat ribbon may be used. The material for the leads is preferably copper or silver coated copper wire. However metals such as silver, gold, nickel, tin, aluminium, chromium, or combinations and alloys thereof such as invar, bronze or nichrome, may be used.

In a preferred embodiment, the leads are held in position against the contact pads by mechanical pressure created by the closure of the packaging. Alternatively, the leads may be soldered or welded to the contacts for additional mechanical stability.

Another method of achieving mechanical stability is to bond the leads to the contacts using an adhesive. This adhesive may be used either to form a permanent bond or to hold the leads in position prior to closure of the packaging, whereafter the leads are held in electrical contact with the contact pads by mechanical force. To improve the electrical connection the adhesive may be metal filled, or otherwise conducting.

In the preferred method, the assembled components are cut to size after lamination and labelling. However, any or all of the component parts may equally be cut and trimmed to size before assembly and closure.

After closure and trimming to size, the assembled component may be protected by the application of a polymer sealing medium, using any commonly known technique, such as dipping or spraying.

Example 1

Figure 3:
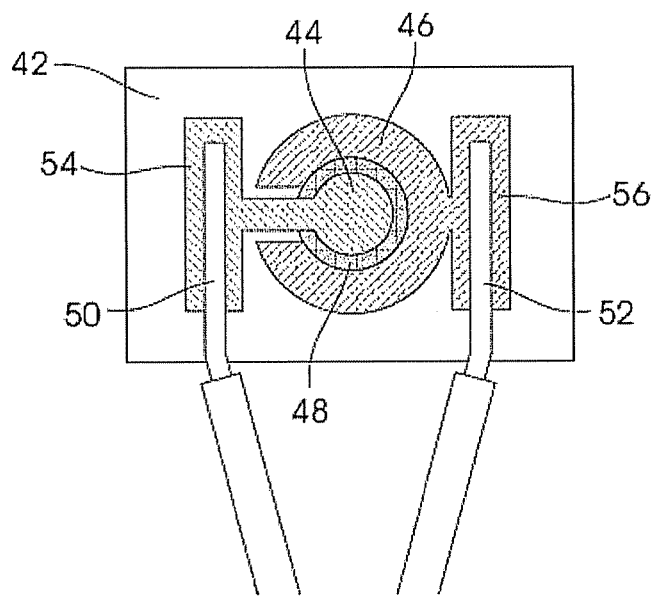
FIG. 3 is a schematic plan view of an example of a printed silicon NTC thermistor fabricated according to the method of the invention.

FIG. 3 shows an example of a series of NTC thermistors which were printed on an 80 g/m² plain paper sheet substrate 42. The thermistor device consists of two concentric electrodes 44 and 46 printed with Du Pont 5000 silver conductor, which are connected or bridged by a printed silicon ring 48. Both the contacts and the silicon ring were deposited by screen printing. The silicon ink used comprises 88% by weight of silicon nanoparticles, milled from 2503 grade metallurgical silicon according to the method described in WO 2009/125370, with an acrylic binder. The overall size of the printed device is 15 mm by 10 mm.

In this example, the paper substrate 42 was trimmed to size before assembly of the complete thermistor. The ends of a pair of connecting leads 50 and 52, composed of insulated 0.5 mm multi-strand copper wire, are held in place on respective contact pads 54 and 56 solely by pressure exerted by an outer insulating layer of packaging material (not shown). The outer insulating layer consisted of 100 micron polyester lamination film and extended outwardly at least 10 mm on three sides around the printed thermistor and at least 100 mm outwardly in the direction of the connecting leads.

For testing the device was immersed in a water bath, such that the exposed sections of the connecting leads remained out of the water. The temperature was varied by heating the water bath on an electric hot plate, while the temperature of the water was recorded with a digital thermometer. The resistance of the device was determined directly using a Keithley Model 2000 digital multimeter.

Figure 4:
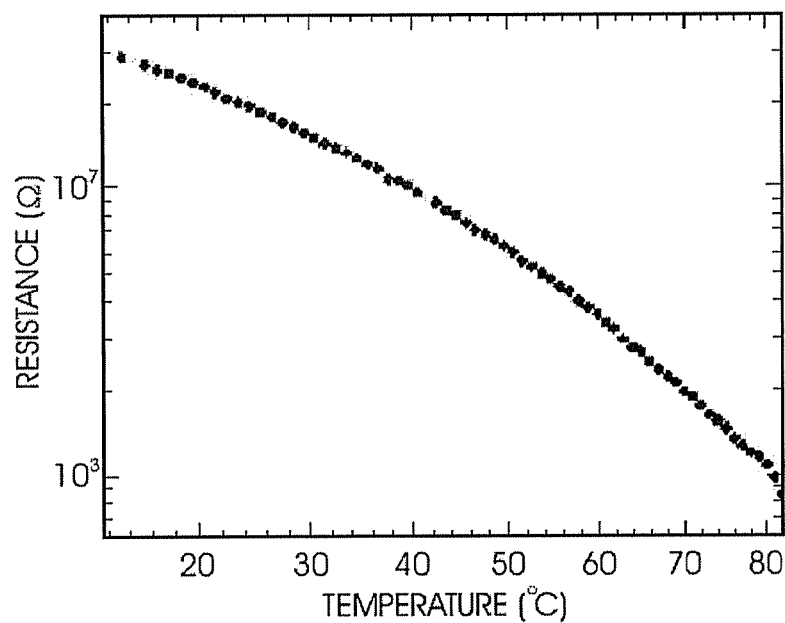
FIG. 4 is a graph showing the resistance-temperature characteristics of the NTC thermistor shown in FIG. 3.

FIG. 4 shows an example of the resistance versus temperature characteristics of a typical device of the type described above, plotted on an Arrhenius scale. The thermistor exhibits at least two regions of temperature in which the resistance varies exponentially with the inverse of the absolute temperature.

Example 2

Figure 5:
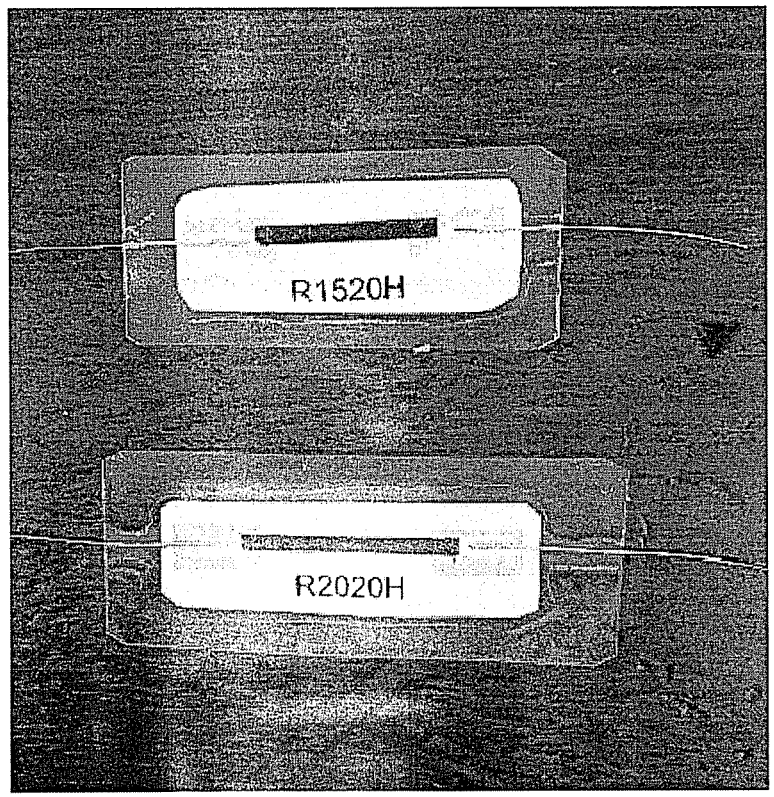
FIG. 5 is a photograph of two examples of printed carbon resistors manufactured according to the method of the invention.

FIG. 5 is a photograph of two examples of printed carbon resistors manufactured according to the method of the invention. Each resistor comprises two silver contact pads, screen printed with Du Pont 5000 Silver conductor on 160 gsm plain paper board as a substrate. A resistive track, composed of a carbon based ink of our own composition, is applied by screen printing between the two contact pads. The value of the resistance is determined by variation of the distance between the contacts, and the width and thickness of the track. In the examples shown the dimensions of the resistive tracks are 20 mm×2 mm and 15 mm×2 mm respectively. The resistances as measured with a Fluke 111 multimeter are 60 k$\Omega$ and 43 k$\Omega$. The connecting leads, which are coaxially disposed, are formed from 0.5 mm copper wire, and are held in place between a pair of outer lamination layers, which each comprise a sheet of 125 micron PET bonded with an ethyl vinyl acetate thermal adhesive. A transparent packaging has been used to show the construction of the device. Similar components, for surface mounting, have been produced without the connecting leads. In this case a part of the substrate with the printed contacts is allowed to protrude from the outer packaging, to allow later connection of suitable leads.

Example 3

Figure 6:
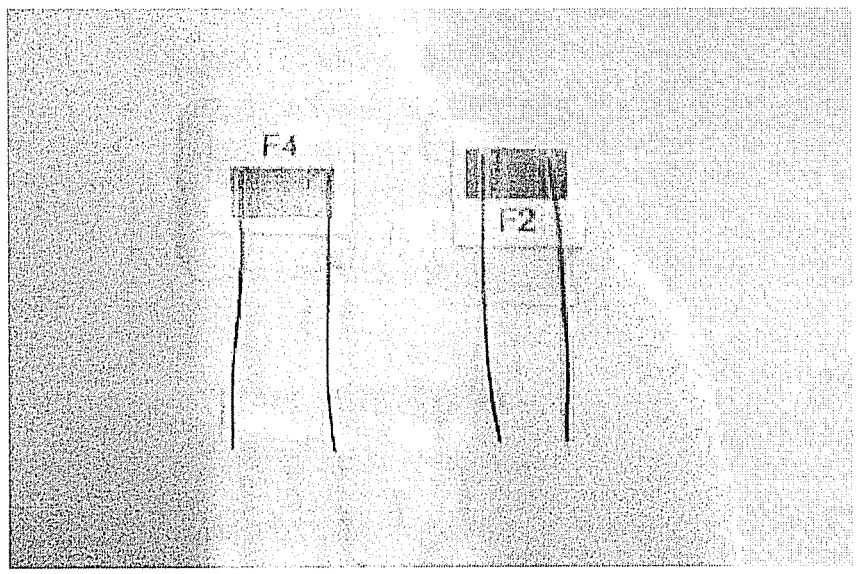
FIG. 6 is a photograph of two capacitors manufactured according to the method of the invention.

FIG. 6 is a photograph of two similar low value capacitors manufactured according to the method of the invention. As in the previous example, a transparent lamination has been used to show the construction of the devices. Two interdigitated sets of four silver electrodes are applied by screen printing using Du Pont 5000 Silver Conductor onto 160 gsm paper board. The dimensions of the electrodes are 7.0 mm×0.75 mm, and are separated by a gap of 0.25 mm along their long edges. Each set of electrodes is connected in parallel, with wide silver tracks which serve as the contact pads. Before assembly, the capacitance of the devices, as measured with a Peak Atlas LCR40 meter, was 2.0±0.2 pF. Two parallel 0.5 mm copper connecting leads are applied to the contact pads and held in place by the outer lamination layers, comprising two 125 micron PET sheets thermally bonded with ethyl vinyl acetate adhesive. After assembly the outer packaging forms part of the dielectric material of the device, in addition to the substrate material. The final value of the capacitance of the assembled devices is 4.0±0.2 pF.

Example 4

Figure 7:
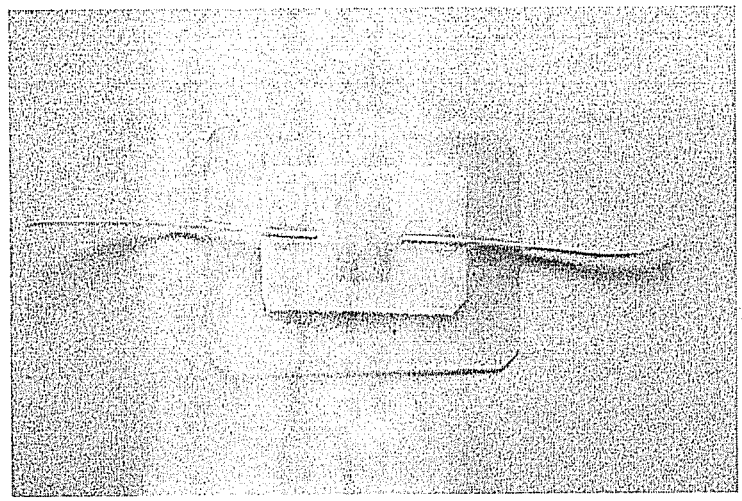
FIG. 7 is a photograph of a parallel plate capacitor manufactured according to the method of the invention

FIG. 7 is a photograph of a parallel plate capacitor manufactured according to the invention. As in examples 2 and 3, the substrate material is 160 gsm paper board, and the outer packaging comprises two sheets of 125 micron PET thermally bonded with ethyl vinyl acetate adhesive. A first layer of silver, comprising a planar electrode 10 mm square, and a 2 mm wide connection to a 4 mm diameter contact pad, is screen printed using Du Pont 5000 Silver Conductor. A 15 mm square of dielectric material (Du Pont 8165) is screen printed over the planar electrode, leaving the extension and contact pad exposed. A second silver layer with the contact pad extending in the opposite direction is then screen printed over the dielectric material, so that the second planar electrode is directly above the first planar electrode. In the example shown 0.5 mm diameter copper connecting leads are applied to the contact pads and fixed in position by the outer packaging. Alternatively, the contact pads may be allowed to protrude from the packaging if a surface mounted device is desired. The capacitance of components of this design is 300±30 pF, as measured with a Peak Atlas LCR40 meter, before assembly, and 400±40 pF after lamination.

The invention claimed is:

1. An electronic component assembly comprising:
   a. a printed component structure comprising at least one of a semiconducting ink, an insulating ink and a conducting ink deposited onto a substrate, the component structure defining at least one contact area;
   b. a connecting lead disposed against or adjacent to said at least one contact area; and
   c. at least one layer of electrically insulating material enclosing the component structure,
   wherein at least one of the substrate and the layer of electrically insulating material is a soft material which can deform plastically or elastically under a small compressive force and has a hardness less than 100 on the Shore A scale or a Brinell hardness less than 30, and an end of the connecting lead is held in electrical contact with the at least one contact pad by pressure exerted on them by the substrate and the at least one layer of electrically insulating material.

2. An electronic component assembly of claim 1 wherein the layer of electrically insulating material includes a polymer film.

3. An electronic component assembly of claim 2 wherein the polymer film includes polyester or polyethylene.

4. An electronic component assembly of claim 1 wherein the layer of electrically insulating material forms an enclosure.

5. An electronic component assembly comprising:
   a. a printed component structure comprising at least one of a semiconducting ink, an insulating ink and a conducting ink deposited onto a substrate, the component structure defining at least one contact area;
   b. a connecting lead disposed against or adjacent to said at least one contact area;
   c. at least one layer of electrically insulating material enclosing the component structure; and
   d. a layer of at least one other material between the substrate surface and the layer of insulating material, said layer of at least one other material comprising a soft material which can deform plastically or elastically under a small compressive force and has a hardness less than 100 on the Shore A scale or a Brinell hardness less than 30, and an end of the connecting lead is held in electrical contact with the at least one contact pad by pressure exerted on them by the substrate and the at least one layer of electrically insulating material.

6. An electronic component assembly of claim 1 wherein the substrate and the layer of electrically insulating material are planar.

7. An electronic component assembly according to claim 1 wherein the substrate comprises paper sheet, card, cardboard, metal foil, plastics sheet material, or polymer film.

8. An electronic component assembly of claim 1 wherein the substrate is a hard material having a hardness greater than 100 on the Shore B scale or a Brinell hardness exceeding 80.

9. The electronic component assembly of claim 8 wherein the substrate comprises metal sheet, sintered ceramic sheet including alumina and clay based materials, crystalline ceramic materials such as quartz and sapphire, sheet or wafer semiconductor materials such as silicon or silicon carbide, or glass sheet.

10. The electronic component assembly of claim 1 wherein the layer of electrically insulating material is a sheet or film of thermoplastic polymer material.

11. An electronic component assembly of claim 1 in which the assembly is protected by a polymer sealing medium applied thereto.

12. Packaging comprising a container or wrapping of packaging material, and an electronic component assembly of claim 1.

13. The electronic component assembly of claim 1, wherein the printed component structure comprises the conducting ink and at least one of the semiconducting ink and the insulating ink.

14. An electronic component assembly of claim 1 or claim 5 wherein the layer of electrically insulating material is a covering applied to the substrate.

15. An electronic component assembly of claim 5 wherein the layer of electrically insulating material includes a polymer film.

16. An electronic component assembly of claim 5 wherein the layer of electrically insulating material forms an enclosure.

17. An electronic component assembly of claim 5 wherein the substrate and the layer of electrically insulating material are planar.

18. An electronic component assembly according to claim 5 wherein the substrate comprises paper sheet, card, cardboard, metal foil, plastics sheet material, or polymer film.

19. An electronic component assembly of claim 5 wherein the substrate is a hard material having a hardness greater than 100 on the Shore B scale or a Brinell hardness exceeding 80.

20. The electronic component assembly of claim 5 wherein the layer of electrically insulating material is a sheet or film of thermoplastic polymer material.

21. An electronic component assembly of claim 5 in which the assembly is protected by a polymer sealing medium applied thereto.

22. Packaging comprising a container or wrapping of packaging material, and an electronic component assembly of claim 5.

23. The electronic component assembly of claim 5, wherein the printed component structure comprises the conducting ink and at least one of the semiconducting ink and the insulating ink.

24. A method of fabricating an electronic component, the method including the steps of:
   a. printing a component structure comprising at least one of a semiconducting ink, an insulating ink and a conducting ink onto a substrate, the component structure defining at least one contact area;
   b. disposing a connecting lead against or adjacent to said at least one contact area; and
   c. applying at least one layer of electrically insulating material to enclose the component structure,
   wherein at least one of the substrate and the layer of electrically insulating material is a soft material which can deform plastically or elastically under a small compressive force and has a hardness less than 100 on the Shore A scale or a Brinell hardness less than 30, and an end of the connecting lead is held in electrical contact with the at least one contact pad by pressure exerted on them by the substrate and the at least one layer of electrically insulating material.

25. The electronic component assembly of claim 24, wherein the printed component structure comprises the conducting ink and at least one of the semiconducting ink and the insulating ink.

26. A method of fabricating an electronic component, the method including the steps of:
   a. printing a component structure comprising at least one of a semiconducting ink, an insulating ink and a conducting ink onto a substrate, the component structure defining at least one contact area;
   b. disposing a connecting lead against or adjacent to said at least one contact area; and
   c. applying at least one layer of electrically insulating material to enclose the component structure; and
   d. including a layer of at least one other material between the substrate surface and the layer of insulating material, said layer of at least one other material comprising a soft material which can deform plastically or elastically under a small compressive force and has a hardness less than 100 on the Shore A scale or a Brinell hardness less than 30, and an end of the connecting lead is held in electrical contact with the at least one contact pad by pressure exerted on them by the substrate and the at least one layer of electrically insulating material.

27. The electronic component assembly of claim 26, wherein the printed component structure comprises the conducting ink and at least one of the semiconducting ink and the insulating ink.

* * * * *